United States Patent
Dutra et al.

(10) Patent No.: US 6,899,785 B2
(45) Date of Patent: May 31, 2005

(54) METHOD OF STABILIZING OXIDE ETCH AND CHAMBER PERFORMANCE USING SEASONING

(75) Inventors: Kellie L. Dutra, Essex Junction, VT (US); Margaret L. Gibson, Underhill, VT (US); Ronald G. Meunier, Westford, VT (US); Jason W. Silbergleit, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 09/682,978

(22) Filed: Nov. 5, 2001

(65) Prior Publication Data

US 2003/0092272 A1 May 15, 2003

(51) Int. Cl.[7] .................................................. C23F 1/00
(52) U.S. Cl. .................... 156/345.3; 438/706; 438/905; 134/1.2; 134/1.3; 156/345.35
(58) Field of Search ................................. 438/694, 706, 438/710, 712, 905; 134/1.1, 1.2, 1.3; 156/345.3, 345.35, 345.39, 345.41, 345.48, 345; 118/715, 723 R; 216/67, 79

(56) References Cited

U.S. PATENT DOCUMENTS

| | | | | |
|---|---|---|---|---|
| 5,087,341 A | * | 2/1992 | Tsukada et al. | 204/192.34 |
| 5,254,216 A | * | 10/1993 | Frank et al. | 216/67 |
| 5,997,685 A | * | 12/1999 | Radhamohan et al. | 156/345.1 |
| 6,083,412 A | * | 7/2000 | Rice et al. | 216/67 |
| 6,191,047 B1 | | 2/2001 | Li et al. | |
| 6,197,699 B1 | | 3/2001 | Fritzinger et al. | |
| 6,217,785 B1 | * | 4/2001 | Collins et al. | 156/345.48 |
| 6,387,288 B1 | * | 5/2002 | Bjorkman et al. | 216/67 |
| 6,444,037 B1 | * | 9/2002 | Frankel et al. | 118/715 |
| 6,508,911 B1 | * | 1/2003 | Han et al. | 118/723 I |

FOREIGN PATENT DOCUMENTS

| | | | | |
|---|---|---|---|---|
| JP | 60-201632 | * | 10/1985 | H01L/21/302 |
| JP | 7201814 A | | 8/1995 | |
| JP | 7263408 A | | 10/1995 | |
| JP | 9082690 A | | 3/1997 | |

* cited by examiner

Primary Examiner—Lan Vinh
(74) Attorney, Agent, or Firm—McGuireWoods LLP; Howard J. Walter

(57) ABSTRACT

Undesirable reactions (such as formation of volatile compounds or complexes) are recognized to occur during production processes (such as etching with fluorine) at interior surfaces of a reactor chamber (such as a silicon-based reactor chamber). These undesirable reactions may be minimized and controlled by priming the chamber surface by incorporating seasoning atoms and/or molecules.

26 Claims, 3 Drawing Sheets

METHOD OF STABILIZING OXIDE ETCH AND CHAMBER PERFORMANCE USING SEASONING

BACKGROUND OF THE INVENTION

1. Field of the Invention

The present invention generally relates to material processing, especially processing of semiconductor materials for electronic devices and, more particularly, to etching processes and reaction vessels therefor.

2. Description of the Prior Art

The potential for improved performance and functionality of integrated circuits, as well as potential economies of manufacture, has driven integrated circuit designs to smaller regimes of minimum feature size or critical dimension (CD). While such reductions in feature size have resulted in stringent resolution requirements for lithography tools, some process variations have been increased to the point of seriously compromising manufacturing yields as feature sizes have decreased.

For example, it is conventional to form portions of electronic elements (e.g. transistors, capacitors and the like) using a plurality of semiconductor layers and to connect these elements in yet additional layers; each layer being separated from lower layers by a so-called interlayer dielectric (generally an oxide) having a nominal thickness through which connections called vias are selectively made. In practice, the thickness of the interlayer dielectric is not generally critical and is not typically varied significantly with the minimum feature size regime of the design. However, it can be readily understood that the transverse dimension of vias must generally correspond to the sizes of connections in the respective layers which will vary with the minimum feature size or critical dimension. Consequently, a reduction in minimum feature size or critical dimension generally corresponds to an increase of the height to width aspect ratio of the via.

In general, vias are formed by etching in accordance with a resist or patterned mask (e.g. of nitride) through a chemical reaction with the insulator/oxide. The reactive material is generally provided as ions in a plasma and the etch rate, which must be relatively high for commercially acceptable throughput, is generally proportional to the number of ions or reactive species which are incident on the surface to be etched. Therefore, high density plasmas are of substantial interest at the present time. However, as the aspect ratio of a via increases as etching proceeds, the relatively random trajectories of ions in a plasma causes the number of ions incident on the surface being etched to vary; resulting in variation in etch rate even between different locations on a wafer. Overetching may damage underlying structures and under etching may not allow a connection to be formed when conductive material is deposited inside the via.

The etch rate is further complicated by the complex reactions which may occur in a reaction vessel and which may involve the vessel itself or contaminants and/or reaction products that may be deposited thereon. Such materials may also become dislodged as particulates and contaminate the wafer being processed while their formation and reactions with the vessel may alter concentrations of reactant species and alter the chemical reactions and relative rates of those reactions taking place in the vessel. It is, of course, desirable to be able to control the reaction in a stable fashion based on as few parameters as possible and preferably only process parameters which are fully controllable such as reactant gas flow rate (and, secondarily, temperature). In practice, such process stability can seldom be obtained due to the complexity of side reactions, varying concentrations of byproducts and lack of accurate temperature control over the entirety of significant dimensions and volume of the reactor vessel.

For example, fluorocarbon gas is often used as a source of highly reactive fluorine ions which leave byproduct carbon ions that tend to form polymers and deposit on relatively cooler surfaces on the interior of the reactor vessel and the workpiece. (Carbon, in particular, may form compounds and/or allotropes which may result in deposits having unpredictable electrical characteristics or alloys which may significantly alter electrical characteristics of other structures.) In general, while measures are taken to maintain a constant and predetermined temperature in the reactor vessel, the temperature of the interior and regions thereof as well as the wafer may vary significantly in practice. Therefore, as the etching proceeds, polymer must be etched from the wafer along with the oxide. Because the etch rate in the vias diminishes with depth (and aspect ratio), an equilibrium between etching and deposition of polymer may be reached and no net further etching can be achieved. This condition is referred to as "etch-stop".

(As used hereinafter, "etch-stop", referring to the above-described equilibrium condition, is to be understood as distinguished from the similarly referenced "etch stop" structure such as a nitride underlying an oxide during an etch process selective thereto. Accordingly, while usage in the art may not be entirely consistent, a hyphenated term will be used to differentiate this condition from the similarly referenced structure. Usage as a verb form as opposed to a noun, often with an associated article such as "an etch stop" may differentiate the terms, as well.)

In an effort to more closely regulate side reactions with the reactor vessel and materials that may be deposited thereon, it is the current practice to periodically subject the reactor vessel to cleaning processes (such as "wetstrips"). Many differing processes for the purpose are known and may be used singly or in combination to remove contaminant materials. So-called seasoning processes may be included in an effort to increase resistance to contaminant deposition or resistant to chemical reaction of the reactor vessel and/or the potential contaminants. However, such processes are costly, especially in terms of tool down-time and are only marginally effective. Premature maintenance, reduced useful lifetime of the reactor vessel, increased wetstrip process costs and processing variability are disadvantages of conventional reactor chambers and manufacturing processes (especially etching processes) practiced in reactor chambers.

In this regard, it should be appreciated that 8000 Angstroms is substantially less than the desirable thickness of interlayer dielectrics at the present state of the art and 15000 Angstroms is marginal for reliable formation of via connections. This relatively wide variation in etch-stop depth also reflects a wide variation in etch rate precluding use of a timed etch process for via depth control (thus requiring more expensive alternatives such as optical emission spectroscopy (OES) for determining process completion) and an instability of control by reactant gas flow rate.

Use of other reactant gases present problems in developing high etch rates and throughput comparable to those available from polymer-forming fluorocarbon gases due to lower reactive ion density, lower reactivity of the ions and/or other effects. While reduced voltages are being used to operate integrated circuits in order to reduce heat dissipation, reduced thickness of interlayer dielectric may compromise dielectric film integrity and potentially impose severe design constraints (to avoid breakdown) if higher voltages are desired in any portion of the chip.

Therefore, it is seen that the development of equilibrium etch-stop conditions may severely compromise manufacturing yield at reduced CDs essential for increased integration density and limits reliable manufacture of integrated circuits at minimum feature size regimes which are otherwise supported by current lithographic techniques and resolution. However, at the present state of the art, there are no economically practical alternatives which allow reliable manufacture of integrated circuits with small CDs at a cost comparable to larger CD regimes.

There continue to be shortcomings with high density plasma (HDP) etch tool process stability with regard to critical dimensions (CD) and etch-stop depth variability due to chamber conditioning. HDP tools show significant issues with foreign material, shallow etch depth and CD matching issues. Foundry technologies drive contact aspect ratios higher than nominal etch depth performance of the chamber. Variability between wetstrips leads to contact opens and scrap. Variability in etch performance leads to premature chamber maintenance.

SUMMARY OF THE INVENTION

It is therefore an object of the present invention to provide a seasoning method and material for stabilizing oxide etch processes and extend high density fluorocarbon etch processes to meet reduced lithography targets.

It is another object of the invention to provide stabilization of reactor vessel surfaces to reduce required maintenance consistent with stable etch rates and to avoid premature etch-stop.

It is a further object of the invention to provide a stable etch process and tool having high throughput with reduced contamination of the tool and/or workpiece with foreign materials, particularly carbon and carbon compounds or alloys, fluorine and fluorine compounds or alloys, and oxygen and oxygen compounds or alloys.

Additionally, it is an object of the invention to use the interior chamber surfaces as a tool for reducing the presence of undesirable materials that circulate in the reactor interior.

In order to accomplish these and other objects of the invention, a preferred embodiment provides a semiconductor production reactor, comprising a reactor comprising at least one interior chamber surface primed to balance receipt of a to-be-controlled material Another preferred embodiment of the invention provides a method of seasoning a reactor chamber, comprising at least the steps of: providing a reactor chamber having at least one interior surface; priming the interior surface of the reactor chamber with a seasoning element or compound containing seasoning atoms or molecules that when combined with the chamber surface and/or a material to be used in the reactor chamber are relatively less volatile than a combination, alone without the seasoning atoms or molecules, of the chamber surface and the material to be used in the reactor chamber.

Additionally, another preferred embodiment of the invention provides an etching method, comprising: providing a reactor chamber having at least one interior surface; priming the interior surface of the reactor to minimize an undesirable reaction (such as formation of a volatile compound or complex such as SiF4) at the surface; and, producing an etched product in the primed reactor chamber.

Another preferred embodiment of the invention provides a method of controlling fluorine in production processes in a reactor, comprising: priming an interior surface of the reaction chamber with seasoning atoms or molecules that reduce the formation of volatile compounds and complexes when fluorine encounters the surface; conducting a production process in the reactor in which fluorine is present in the reaction chamber.

In a particularly preferred embodiment of the invention, the chamber surface may be primed to block an etching material (such as an etching material selected from the group consisting of fluorine (such as F or F2), chlorine (such as Cl or Cl2), oxygen, argon, bromine, fluorocarbons and chlorofluorocarbons). The primed surface may include an equilibrium-shifting substance for impeding reaction between the chamber surface and the to-be-controlled material. By way of example, the primed interior surface may include a substance that binds with silicon and minimizes Si—F bonding. One such inventive primed chamber surface includes cobalt-silicon and/or cobalt-fluorine bonds.

In a particularly preferred embodiment of the invention, the primed interior chamber surface minimizes volatile compound or complex formation upon a to-be-controlled material contacting the interior chamber surface.

Also, the invention provides for particularly preferred embodiments wherein the interior surface after priming includes Si—Co and/or Co—F bonds.

In especially preferred embodiments, the invention may be practiced in conjunction with producing an oxide or oxynitride film or etching (such as etching via holes).

In another especially preferred embodiment, the invention teaches priming and periodically cleaning the reactor chamber interior surface, and primed and cleaned reactor chamber interior surface.

The foregoing and other objects, aspects and advantages will be better understood from the following detailed description of a preferred embodiment of the invention with reference to the accompanying drawings.

DETAILED DESCRIPTION OF THE PREFERRED EMBODIMENT OF THE INVENTION

Figure 1A:
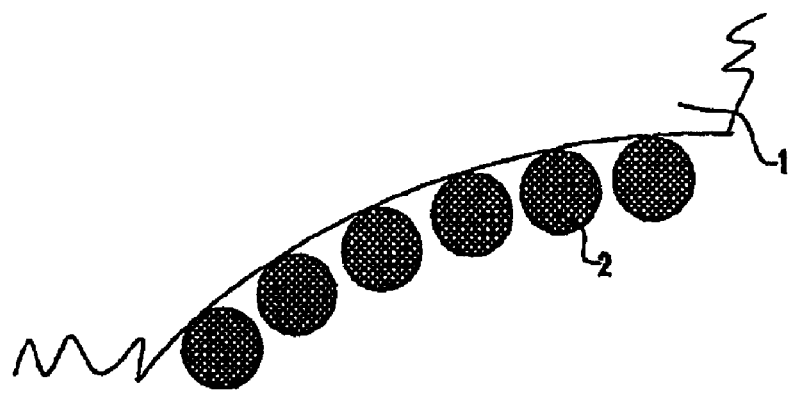
FIGS. 1A–C constitute a representational diagram on a molecular scale of an example of priming a reactor surface, and using the primed reactor surface during a production process, according to the invention.

The present invention exploits the recognition that inside a reactor chamber in which a production process (such as etching) is performed, undesirable reactions may occur at the reactor chamber surface, especially undesirable reactions that consume reactants (such as etching material) from the production process. Thus, undesirable reactions at the reactor chamber surface are identified.

In a further aspect of the invention, the identified undesirable reactions are minimized such as by priming an interior reactor chamber surface, such as by incorporating molecules or atoms into an interior reactor chamber surface. The present invention thus advantageously controls the presence and effect of materials present during production processes in a reactor chamber.

A reactor with which the invention may be used includes any reactor having at least one interior surface that may be primed to control the presence or effect of materials (such as etching materials) present inside the reaction chamber during production processes, such as a reactor having a silicon-based interior surface (such as HDP 5200 and 5300 Centura mainframe reactors and IPS 5200 Centura II mainframe, all manufactured by Applied Materials and commercially available). Preferred examples of such chambers are silicon-based chambers, silicon carbide based chambers, etc. The invention provides a framework for evaluating any internal reactor surface (such as a reactor surface that is silicon-based, silicon-carbide-based, stainless steel, etc.) to maximize the amount of a material that is being used to perform a production objective (such as etching). The interaction, if any, between a material (such as an etching gas) being used to perform a production objective (such as etching) and the interior reactor surface is identified. For an interaction (such as formation of a volatile compound or complex such as SiF4) identified as having a disadvantageous effect on the production of the article (such as an undesirable etch-stop profile), the invention provides for intervening to minimize such an interaction.

The interior region of the reactor to be primed may include all or any part of the interior surface of the reactor. Most preferably, one or more walls are primed.

The molecules or atoms being incorporated into the reactor chamber surface are selected based on the respective interactions (such as bond strengths, stability, etc.) between the chamber surface and the to-be-controlled material (such as etching material) and, respectively, between the chamber surface and the to-be-incorporated molecules or atoms, with the set of interactions being assessed under the processing conditions (e.g., pressure, time, temperature) that are to be used in the production process in the reactor chamber in which the to-be-controlled material is to be used.

To-be-introduced molecules or atoms having thus been selected according to the invention, priming may be accomplished by introducing those atoms or molecules into the chamber under conditions such that the atoms or molecules are incorporated into the chamber surface. The source of the to-be-incorporated atoms or molecules may be an element or a compound. In a particularly preferred example, a solid (such as a wafer, most preferably, a cobalt-containing wafer) is placed in the chamber. In seasoning a reactor chamber according to the invention, over-seasoning of the chamber preferably is avoided, such as by examining an etch-stop profile. Undesirable over-seasoning may be detected by changes in the etch-stop profile of a device being manufactured. Applying seasoning in relatively small increments is particularly preferred for avoiding over-seasoning.

Figure 1B:
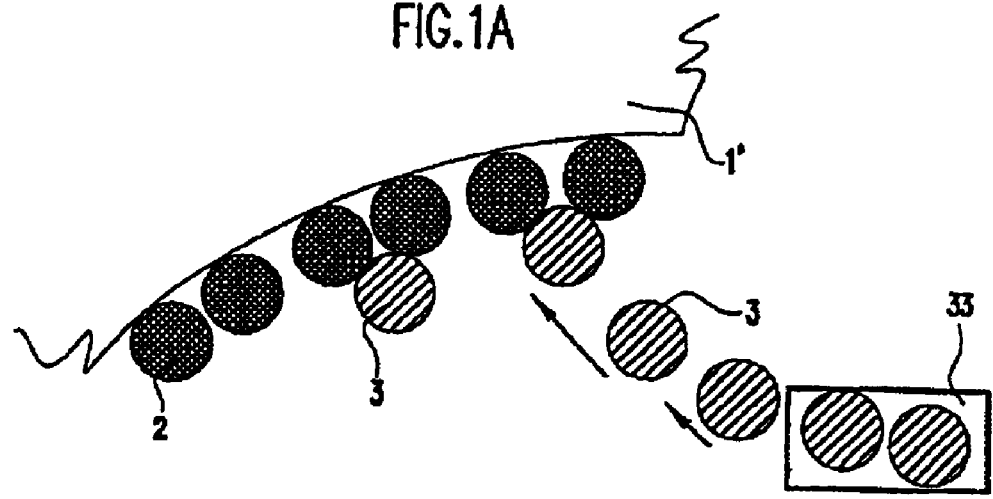
Figure 1C:
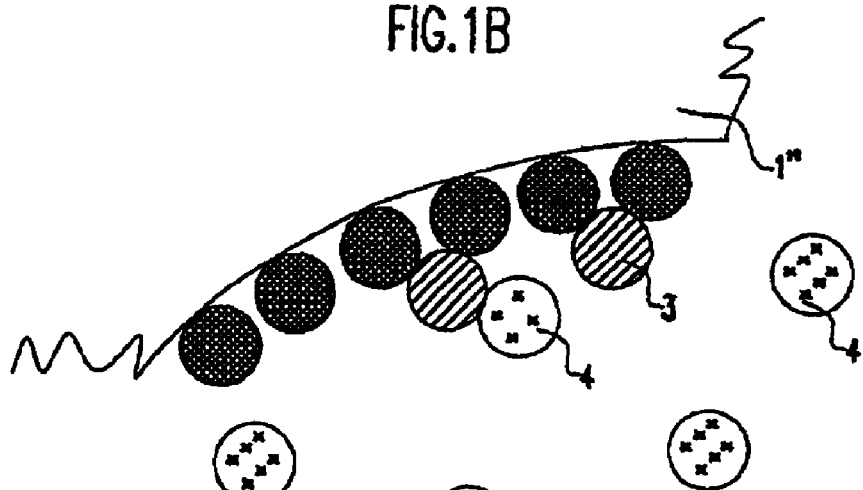

An example of priming according to the invention may be seen with respect to FIGS. 1A–C. FIG. 1A represents a reactor surface 1 before priming. The reactor surface is comprised of surface molecules or atoms 2 (e.g., silicon, native oxide, etc.). As shown in FIG. 1B, seasoning molecules or atoms 3 (such as cobalt) are incorporated into the reactor surface 1'.

As seasoning molecules or atoms 3 may be used any molecules or atoms that when combined with the surface molecules or atoms 2 of the reactor surface 1 form a compound or complex that is relatively less volatile than the compound or complex formed by the to-be-controlled material (such as an etching gas) 4 and the surface molecules or atoms 2 of the reactor surface 1. Seasoning molecules or atoms 3 may be the same or different.

For example, in the case when surface 1 is in a silicon-based reaction chamber in which a fluorine etching process is to be performed, the compounds and complexes formed containing silicon (Si) and fluorine (F) are considered. Formation of SiF4 during etching processes is problematic because SiF4 is volatile and leaves the chamber surface. The fluorine, which is needed for etching, is no longer available for the intended etching use. To replace fluorine, introducing replacement fluorine into the chamber via a usual vehicle (such as a fluorocarbon) undesirably delivers more carbon into the reaction chamber. Thus, minimizing SiF4 formation is desirable. Silicon-fluoride containing compounds that contain cobalt are less volatile than SiF4, and thus cobalt may be used as the atom to be incorporated into the surface 1 for the particular example of a silicon-based surface 1 used in conjunction with a production process in which fluorine etching gas is to be supplied. It will be appreciated that the seasoning atoms or molecules 3 will vary depending on the characteristics of the chamber surface 1 and of the materials to be used in the chamber during production processes Returning to FIG. 1B, the seasoning molecules or atoms 3 are shown being supplied by a source 33 which may be a solid, liquid or gas that releases seasoning molecules or atoms 3. A solid (such as a wafer) is most preferred as the source 33. By seasoning atom and/or molecule incorporation according to the invention, a primed surface 1' is thereby provided, as shown in FIG. 1B. As a preferred example of a technique for delivering seasoning molecules or atoms 3 to the reactor surface 1 where they are incorporated may be mentioned a process in which a source 33 (such as cobalt metal on a wafer) is subjected to ion bombardment and sputtering occurs whereby seasoning molecules or atoms 3 (such as cobalt) are released from the source 33 and proceed to the reactor surface 1 where they are incorporated.

The source 33 may be an element or compound in any form (e.g., solid, liquid or gas). In selecting the source 33, the desired to-be-incorporated seasoning atoms or molecules 3, the particular to-be-controlled material 4, the surface molecules and atoms 2 of the reactor, and reactor environment (such as time, temperature, pressure, power, etc.) may be considered. For use in a silicon-based reactor in which a fluorine etching material is to be provided, a source 33 may be, e.g., elements and/or compounds that are cobalt-based, aluminum-based, copper-based, titanium-based, silicon-based, etc., with preferred examples being cobalt-based and aluminum-based, and a most preferred example being cobalt-based. In some cases, seasoning molecules or atoms 3 supplied by the source 33 may also be supplemented by molecules or atoms 3 from an article (such as a cobalt-containing wafer) under production in the reaction chamber. In the present invention, the product to be etched or otherwise processed in the chamber may be considered, with the source 33 of molecules or atoms 3 being formulated and/or the conditions of source 33 being used to season the chamber being adjusted for whether the product under production will contribute any molecules or atoms 3, e.g., if a product containing seasoning molecules or atoms 3 (such as cobalt) is being made in the chamber, then the quantity of seasoning molecules or atoms 3 from source 33 may be reduced or eliminated.

When a production process is conducted in the reactor, as shown in FIG. 1C, to-be-controlled material 4 (such as etching material, e.g., fluorine, such as F or F2) is in the reactor environment. In the exemplary reactor chamber surface of FIG. 1C, the primed reactor chamber surface 1" may receive to-be-controlled material 4 by bonding between to-be-controlled material 4 and seasoning molecules or atoms 3 to form a relatively non-volatile compound or complex. Although the to-be-controlled material 4 generally speaking is not absolutely prevented from undesirable bonding with any surface molecule 2, such undesirable bonding is minimized by the availability of the alternative bond with the seasoning molecules or atoms 3.

An example may be mentioned where the inventive primed reactor surface 1' is cobalt-primed and is part of a silicon-based reaction chamber in which a wafer is being etched with a to-be-controlled material 4 that in this example is a fluorine gas. In such an example of fluorine etching in a cobalt-primed reactor, some fluorine will travel to the wafer and etch the wafer; some fluorine will travel to the primed reactor surface 1" (see FIG. 1C) and not be retained at the surface 1"; some fluorine will interact with the cobalt at the surface 1" and relatively non-volatile Co—F compounds and complexes will be formed (fluorinated cobalt being almost passivated); some fluorine may interact with silicon at the surface 1" forming compounds or complexes with Si—F bonds. There may be formed Si—F containing compounds and complexes other than SiF4 and there may be formed SiF4, preferably a minimized amount of SiF4, and most preferably no SiF4. Formation of SiF4 at the surface 1" is undesirable because SiF4 is volatile and departs from the surface 1". Any formation of SiF4 at the surface 1" undesirably removes four fluorine atoms from availability for etching. The departure of SiF4 from the surface 1" exposes fresh silicon which is then available for interacting with more fluorine and removing further fluorine from its desired etching task. The present invention minimizes the formation of Si—F bonds at the surface, including but not limited to the formation of SiF4 at the surface. The present invention further minimizes degradation of the silicon content in the surface 1". Thus, the present invention reduces diversion of fluorine from its wafer-etching objective, thereby extending etch-time for a particular quantity of fluorine introduced into a reactor chamber. It will be appreciated that the present invention does not completely eliminate, but rather, minimizes fluorine diversion from etching objectives. While such advantages of the invention have been mentioned herein with regard to a preferred example, the advantageous results provided by the invention extend to other to-be-controlled materials 4, other seasoning molecules or atoms 3, other reactor surface molecules 2 and other processes performed on articles being manufactured. A primed reactor surface thus provides advantageous performance in various embodiments of the present invention.

Figure 2A:
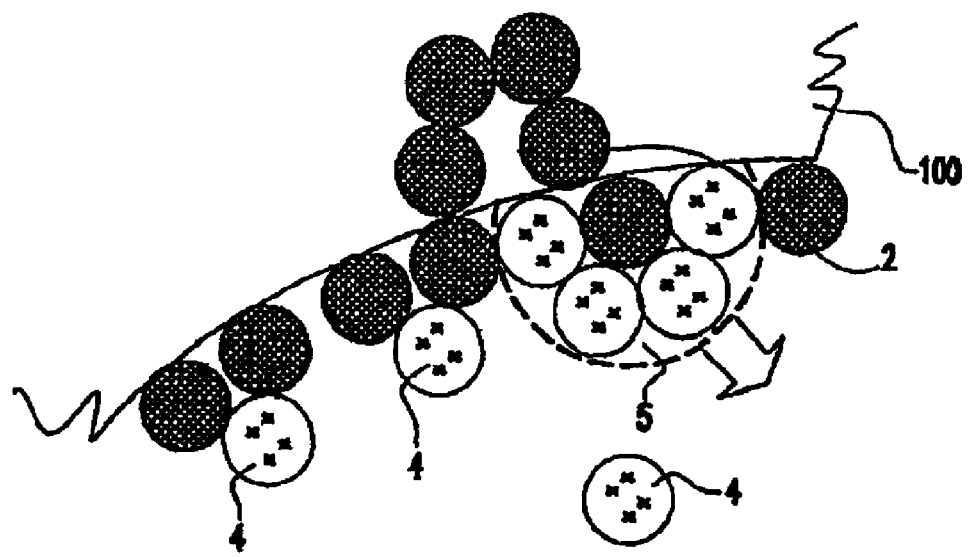
FIGS. 2A–2B constitute a representational diagram on a molecular scale of a reactor surface (such as a prior art reactor surface) that has not been primed according to the invention
Figure 2B:
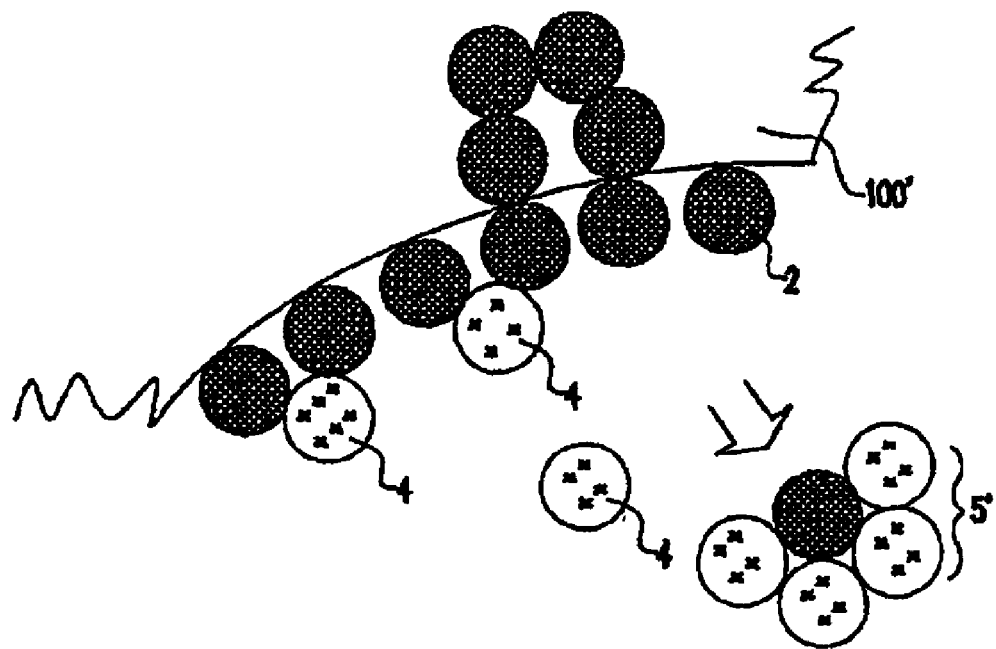

By contrast, if the reactor is operated with an unprimed surface (an example of which is shown in FIGS. 2A–2B), in certain combinations of surface molecules and atoms 2, to-be-controlled materials (such as etching materials) 4, the unprimed surface 100 receives relatively large amounts of the to-be-controlled material 4 during the production process in which to-be-controlled material 4 is in use for etching or other production objectives. The to-be-controlled material 4 and the surface molecules 2 interact (such as formation of Si—F bonds) and form into relatively volatile compounds 5 (such as SiF4) at the reactor surface 100 as shown in FIG. 2A. The surface 100 loses the volatile compounds 5' (see FIG. 2B). To-be-controlled materials 4 that are incorporated in volatile compounds 5, 5' are unavailable for production objectives such as etching. Moreover, when volatile compounds 5' leave the surface 100, a degraded surface 100' results, in which one or more surface molecules or atoms 2 are newly exposed. In addition to the degradation of the chamber surface 100', which is generally undesirable, the newly exposed surface atoms or molecules 2 have the ability to take more to-be-controlled materials 4 away from their production objectives such as etching. Degradation of the reactor surface and formation of volatile compounds and complexes including the to-be-controlled materials (such as etching gases) are associated with imbalanced equilibria during manufacturing processes such as etching, e.g., premature etch-stop.

Thus the invention advantageously provides for blocking sites in the reactor surface where to-be-controlled material otherwise could incorporate itself. Referring to FIGS. 1B and 1C, the incorporated seasoning atoms or molecules 3 when bound to the surface atoms or molecules 2 of the surface 1' are relatively non-volatile, and remain relatively non-volatile when any to-be-controlled materials 4 (such as etching gases) are further incorporated. Thus the amount of to-be-controlled materials 4 (such as etching gases) removed from their intended use (such as etching) by interaction with the chamber surface is minimized. It will be appreciated that the present invention avoids undesirable formation of a volatile compound containing certain surface molecules or atoms 2 of the primed surface 1', but that some formation at the reactor chamber surface of volatile compounds still may occur. By priming according to the invention, undesirable volatile compound formation may be minimized and reduction of degradation of the surface accomplished but not necessarily completely reduced to zero. The present invention provides for advantageously shifting the equilibrium of the undesirable volatile compound formation reaction in which the chamber surface molecules or atoms 2 and the to-be-controlled material 4 (such as an etching material) participate in the absence of priming. In the case of performing etching in the reaction chamber, use of priming according to the invention minimizes etching material from being consumed by the reaction. Advantageously the invention may be used to manage confining a reaction to a wafer under production and to minimize undesirable reactions that occur between etching material and the reactor chamber in which the etching is proceeding. By priming the reactor surface according to the invention, the role of the reaction chamber surface is greatly reduced and the amount of to-be-controlled material (such as an etching material, e.g., fluorine) may be controlled based on gas flow. Thus, priming interior reactor surfaces according to the present invention may be used to maintain high levels of to-be-controlled materials during production processes, such as high levels of etching gases (such as fluorine).

A reactor chamber that has been primed according to the invention advantageously may be used for performing production processes, such as semiconductor production processes. The methods and apparatuses of the invention may be used in etching, such as a method comprising: providing a reactor chamber having at least one interior surface; priming the interior surface of the reactor chamber; and producing an etched product in the primed reactor chamber. The production processes in the primed reactor may include, e.g., producing an oxide film, etching via holes, etc. After a production process has been performed in a primed reactor, the primed chamber interior surface has not been substantially altered from its pre-production surface 1' (see FIG. 1C) and includes minimal volatile etching material 4 such as fluorine.

As production processes are performed in the reactor, deposits (such as polymer deposits) are formed. Preferably, the chamber is cleaned (such as wet-cleaning without removing the roof or wet-cleaning in which the roof is removed), such as periodic cleaning (such as after about every tenth wafer produced in the chamber). An example of cleaning is etching-off oxides (from the roof, sidewalls and chuck), followed by an oxygen plasma treatment with biased power, followed by oxygen plasma treatment without biased power. After cleaning, a wafer (such as a cobalt-containing wafer or a non-cobalt-containing wafer) may be run and its etch-stop profile reviewed, and where an unsatisfactory etch-stop profile is obtained, seasoning according to the invention may be performed.

The invention provides a technique for rendering a high density plasma (HDP) oxide etch process more stable by primed chamber walls incorporating a reaction product (such as a cobalt-based reaction product such as Co—F, Si—Co, etc.). The invention thus provides improved etch characteristics and chamber performance, e.g., etch depth, critical dimension matching, etch profile, resist selectivity. Advantageously, the invention reduces wafer scrap due to contact opens.

As examples of the products that may be produced in the reaction chamber may be mentioned organic materials and films. As examples of the films that may be etched during processes according to the invention may be mentioned oxide films, silicon nitride films, titanium silicide films, cobalt silicon films, polysilicon films, etc. The films may be doped or undoped. As an example of the film production techniques with which the present invention may be used, is mentioned high density plasma etching.

It will be appreciated that the methods and apparatuses of the invention may be used in semiconductor manufacture and in other manufacturing, such as manufacturing in a reactor in which a material to be controlled (such as fluorine) is identified. Such methods comprise providing a reactor having at least one interior surface; priming the reactor interior surface with selected atoms or molecules (with the atoms or molecules selected as discussed above); and conducting a production process in the reactor in which the to-be-controlled material (such as fluorine) is present in the reaction chamber.

The present invention thereby improves etch depth, etch depth being directly related to polymer produced by the chamber chemistry and polymer residue in the chamber.

Figure 3:
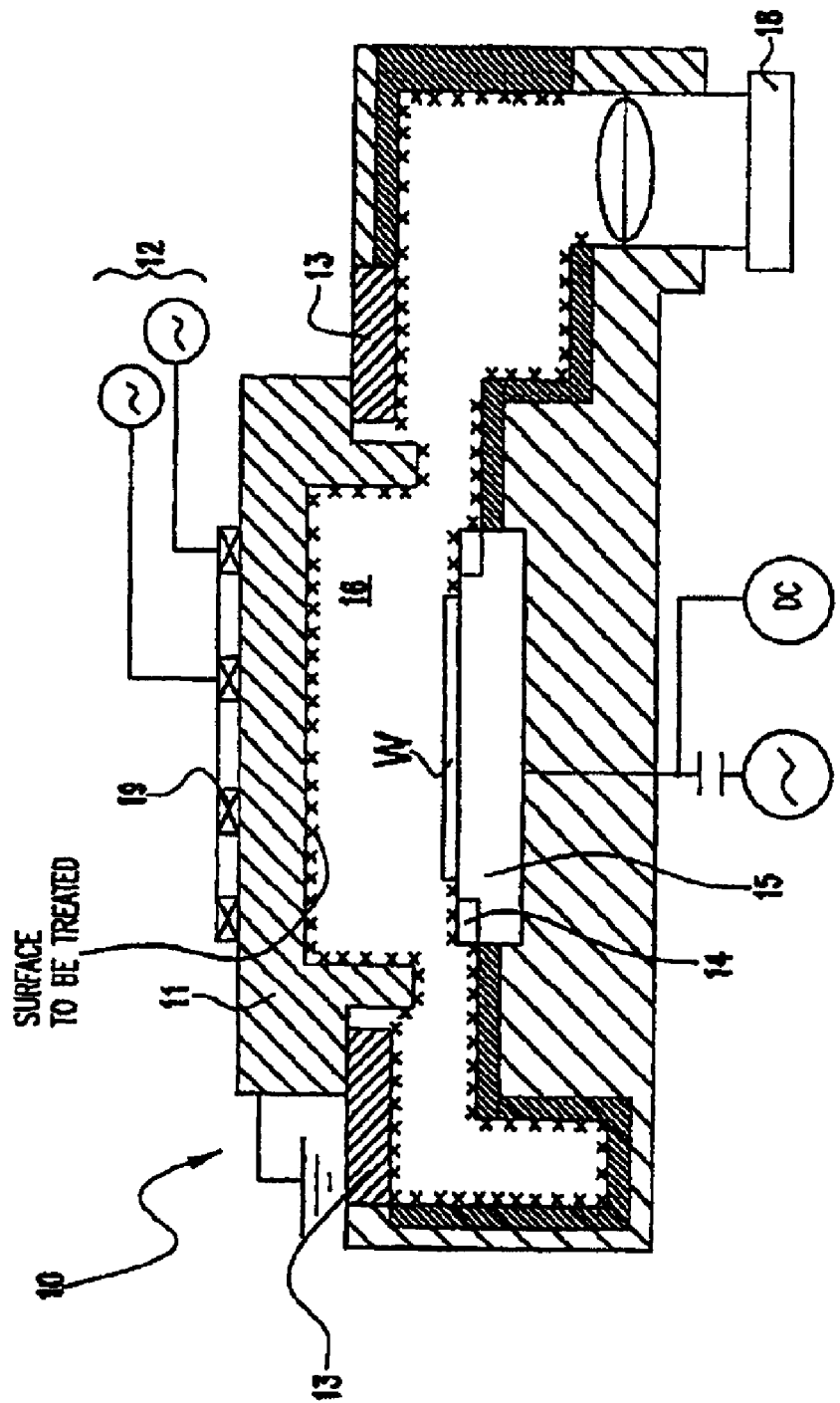
FIG. 3 is a cross-sectional representational view of an exemplary reactor chamber according to the present invention and which may be used in practicing methods according to the present invention.

An exemplary reactor chamber with which the present invention may be practiced is shown in FIG. 3, in which are shown usual but not necessarily required features of a reactor chamber 10 typically used in an etching production process. The reactor 10 is provided with a roof 11 (the roof preferably being seasoned), power source 12 (such as coils 19), removable liner 13, silicon base ring and silicon collar 14, e-chuck 15 (such as a clampless electrostatic chuck (ESC)), plasma confinement area 16 and vacuum pump 18. Wafer (W) may be a source 33 of seasoning molecules or atoms 3 and is shown positioned in an exemplary location on the e-chuck 15, but may be placed elsewhere in the reactor 10. Wafer (W) may be a wafer other than source 33. Interior chamber surface regions shown by "x" preferably are primed according to the invention. The "x"s are representational and do not indicate the relative amounts of seasoning molecules or atoms at a particular surface region; some surface regions may have relatively greater amounts of seasoning molecules or atoms.

While the invention has primarily been discussed with reference to silicon-based chambers, the invention may be extended to other chambers such as plasma deposition chambers (such as stainless steel chambers). While the invention has primarily been discussed with reference to fluorine etching gases, the invention may be extended to other etching gases, such as reagent gases for silicon-oxide film formation (such as silane, ammonia, etc.), reagent gases for oxynitride film formation (such as NO2, dichlorosilane, etc.), etc.

EXAMPLE 1

Interior surfaces of silicon chambers in which fluorine etching of various wafers had been performed were examined, by observing the surfaces of removable plug sections of the chambers. The characteristics of the wafer being etched were not particularly considered at this phase of the experimentation. For each chamber, the surface was observed for content of atoms and molecules using x-ray photoelectron spectroscopy (also known as ESCA or XPS). Etch-stop profiles associated with each chamber were obtained and considered, with data shown below in Table 1. Surfaces were grouped according to whether they were associated with an acceptable or unacceptable etch-stop profile, and the surfaces from the "acceptable" group were compared with the surfaces from the "unacceptable" group. Chamber surfaces associated with acceptable etch-stop profiles were found in each instance to include cobalt (along with other atoms and molecules), with cobalt being present in an amount of at least about 8 atom %. Chamber surfaces associated with unacceptable, too-short etch-stop profiles were found in each instance to either lack cobalt or have relatively low cobalt (i.e., cobalt in an amount less than about 8 atom %.

|  | RF Hrs | Etch Profile | C | N | O | F | Al | Si | Co | Cu |
|---|---|---|---|---|---|---|---|---|---|---|
| T1A | 712 | good | 5.1 | 0.5 | 8.1 | 56.2 | 9.9 | 6.4 | 12.3 | 1.8 |
| T1B | 753 | good | 4.5 | 0.5 | 3.9 | 61.3 | 12.2 | 2.7 | 13.2 | 1.7 |
| T1B | 190 | bad | 16.1 | 1.3 | 27.3 | 28.1 | 4.7 | 14.0 | 7.5 | 1.1 |
| T2C | 100 | good | 16.6 | — | 29.2 | 26.7 | — | 18.7 | 8.2 | 0.6 |
| T2B | 400 | good | 13.2 | 0.5 | 13.1 | 45.8 | 9.5 | 8.1 | 8.9 | 1.0 |
| T2B | new | bad | 21.8 | 1.0 | 45.4 | 3.6 | — | 28.0 | 0.2 | — |

"—" means none-detected, <0.1 A%

Table 1: Relative average plug surface composition in atom percent (A%) estimated from XPS/ESCA survey scans For the results set forth in Table 1 above, sample reactors T1A (Tool 1, chamber A), T1B (Tool 1, chamber B), T2C (Tool 2 Chamber C) and T2B (Tool 2, Chamber B) were tested. Each tool was a two-chambered mainframe.

Comparing the ESCA data for Tool1 with long RF hours (process time), it is seen that both "good" chambers had higher surface concentrations of Co, Cu, Al, and F and less surface C, N, O, and Si than the "bad" chamber.

Plugs were pulled from "good" chambers on Tool 2 after fewer RF hours. Comparing the Tool 2 plug surfaces from good and bad chambers again showed increased metal and fluorine concentrations with decreased C, N, O, and Si concentrations associated with the good chambers of Tool 2 relative to the bad chamber of Tool 2.

EXAMPLE 2

A wafer with a surface layer of cobalt metal was placed inside a silicon-based reactor chamber, in the center on the chuck at the same position where a product article would normally be placed. With a ring temperature of 270 degrees C., roof temperature of 200 degrees C., and pressure at 7 millitorrs, the cobalt wafer was maintained in the chamber for 60 seconds. Power was provided as follows: biased power of 1400 watts; inner power source of 300 watts; outer power source of 1040 watts. Before introducing the product, the cobalt wafer was removed from the chamber.

EXAMPLE 3

Plugs pulled from a chamber operated according to Example 2 were subjected to ESCA surface analysis. For plugs pulled from a chamber with bad etch profiles (prior to seasoning) ESCA surface analysis detected less than 1A % Co and 6A % F. After seasoning with a cobalt covered wafer, good etch profiles were observed and T-plugs showed surface concentrations of 9A % Co, 20A % F, and decreased amounts of C, O, and Si.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

What is claimed is:

1. A semiconductor production reactor comprising at least one interior chamber surface, the at least one interior chamber surface comprising a first material and a substance incorporated in the first material, the substance balances receipt of a to-be-controlled material.

2. The reactor of claim 1, wherein the interior chamber surface minimizes volatile compound or complex formation upon a to-be-controlled material contacting the interior chamber surface.

3. The reactor of claim 1, wherein the surface blocks an etching material.

4. The reactor of claim 3, wherein the blocked etching material is selected from the group consisting of fluorine, chlorine, oxygen, argon, bromine, fluorocarbons and chlorofluorocarbons.

5. The chamber of claim 1, wherein the substance binds with silicon and minimizes Si—F bonding.

6. The chamber of claim 1, wherein the substance minimizes formation of a volatile compound or complex.

7. The chamber of claim 1, wherein the substance minimizes $SiF_4$ formation.

8. The chamber of claim 1, wherein the chamber comprises silicon or silicon carbide.

9. The chamber of claim 1, wherein the substance impedes reaction between the chamber surface and the to-be-controlled material.

10. The chamber of claim 1, wherein the chamber surface includes cobalt-silicon bonds and/or cobalt-fluorine bonds.

11. The chamber of claim 1, comprising a cleaned and substance-containing chamber surface.

12. The chamber of claim 1, including at least about 8 atom % cobalt in the at least one interior chamber surface.

13. A method of seasoning a reactor chamber, comprising at least the steps of:

providing a reactor chamber having at least one interior surface, the at least one interior surface comprising a first material;

incorporating a substance in the first material of the interior surface of the reactor chamber, the substance comprising a seasoning element or compound containing seasoning atoms or molecules that when combined with the chamber surface and/or a material to be used in the reactor chamber are relatively less volatile than a combination, alone without the seasoning atoms or molecules, of the chamber surface and the material to be used in the reactor chamber.

14. The method of claim 13, wherein the step of incorporating a substance includes placing the seasoning element or compound in solid form in the reaction chamber.

15. The method of claim 13, wherein a cobalt-containing solid is placed in the chamber.

16. The method of claim 13, wherein the seasoning element or compound is selected from the group consisting of cobalt-based elements or compounds, aluminum-based elements or compounds, copper-based elements or compounds, titanium-based elements or compounds and silicon-based elements or compounds.

17. The seasoning method of claim 13, including periodic cleaning of the chamber.

18. An etching method, comprising:

providing a reactor chamber having at least one interior surface comprising a first material;

incorporating a substance in the first material of the interior surface of the reactor to minimize an undesirable reaction at the surface and to prime the reactor; and producing an etched product in the primed reactor chamber.

19. The etching method of claim 18, wherein the undesirable reaction is formation of a volatile compound or complex.

20. The etching method of claim 18, wherein the undesirable reaction is formation of $SiF_4$.

21. The method of claim 18, wherein after the step of incorporating the substance, the interior surface includes Si—Co and/or Co—F bonds.

22. The method of claim 18, including producing an oxide or oxynitride film or etching via holes.

23. The method of claim 18, including periodically cleaning the chamber.

24. A method of controlling fluorine in production processes in a reactor, comprising at least the steps of:

incorporating a substance in a first material of an interior surface of the reaction chamber, the substance comprising seasoning atoms or molecules that reduce the formation of volatile compounds and complexes when fluorine encounters the surface; and conducting a production process in the reactor in which fluorine is present in the reaction chamber.

25. The method of claim 24, wherein the production process includes etching.

26. The method of claim 24, further including periodic cleaning of the reaction chamber.

* * * * *